(12) United States Patent
Lin et al.

(10) Patent No.: US 11,728,227 B1
(45) Date of Patent: Aug. 15, 2023

(54) TEST STRUCTURE AND TEST METHOD THEREOF

(71) Applicant: Taiwan Semiconductor Manufacturing Company, Ltd., Hsinchu (TW)

(72) Inventors: Jing-Yi Lin, Taipei (TW); Chih-Chuan Yang, Tainan (TW); Kuo-Hsiu Hsu, Zhongli (TW); Lien-Jung Hung, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/743,656

(22) Filed: May 13, 2022

(51) Int. Cl.
*H01L 21/66* (2006.01)
*G01R 31/28* (2006.01)

(52) U.S. Cl.
CPC .......... *H01L 22/32* (2013.01); *G01R 31/2884* (2013.01)

(58) Field of Classification Search
CPC .............................. H01L 22/32; G01R 31/2884
USPC .................................. 324/750.3, 537, 500
See application file for complete search history.

(56) References Cited

U.S. PATENT DOCUMENTS

| | | | |
|---|---|---|---|
| 11,610,818 B2* | 3/2023 | Chen | H01L 27/0886 |
| 11,610,866 B2* | 3/2023 | Yu | H01L 23/3185 |
| 11,611,038 B2* | 3/2023 | Chang | H10B 63/30 |

* cited by examiner

*Primary Examiner* — Giovanni Astacio-Oquendo
(74) *Attorney, Agent, or Firm* — McClure, Qualey & Rodack, LLP

(57) ABSTRACT

Test structures on a wafer are provided. A plurality of cells are arranged in rows and columns of a test array. First and second output pads are formed on opposite sides of the test array. A first output pad is coupled to the cells in one half of the rows of the test array. A second output pad is coupled to the cells in the other half of the rows of the test array. Each first input pad is coupled to the cells in respective column of the test array. Each second input pad is coupled to the cells in respective row of the test array. When a first voltage is applied to one of the first input pads and a second voltage is applied to one of the second input pads, current flowing through the turned-on cell is measured through the first or second output pad.

20 Claims, 15 Drawing Sheets

TEST STRUCTURE AND TEST METHOD THEREOF

BACKGROUND

Integrated circuits (ICs) are widely used in various electronic systems and devices, such as automotive controls, aircraft, data processing systems, portable devices, computers, and televisions. Semiconductor wafers, each has multiple dies, are produced by a plurality of processes in a wafer fabrication facility (fab). Each process step may introduce new defects, quality and reliability issues, failures, and yield losses. To improve manufacturing technologies and enhance IC (wafer) quality, reliability, and yield, the semiconductor wafers are measured, tested, monitored, and analyzed using a method such as failure mode analysis.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1:
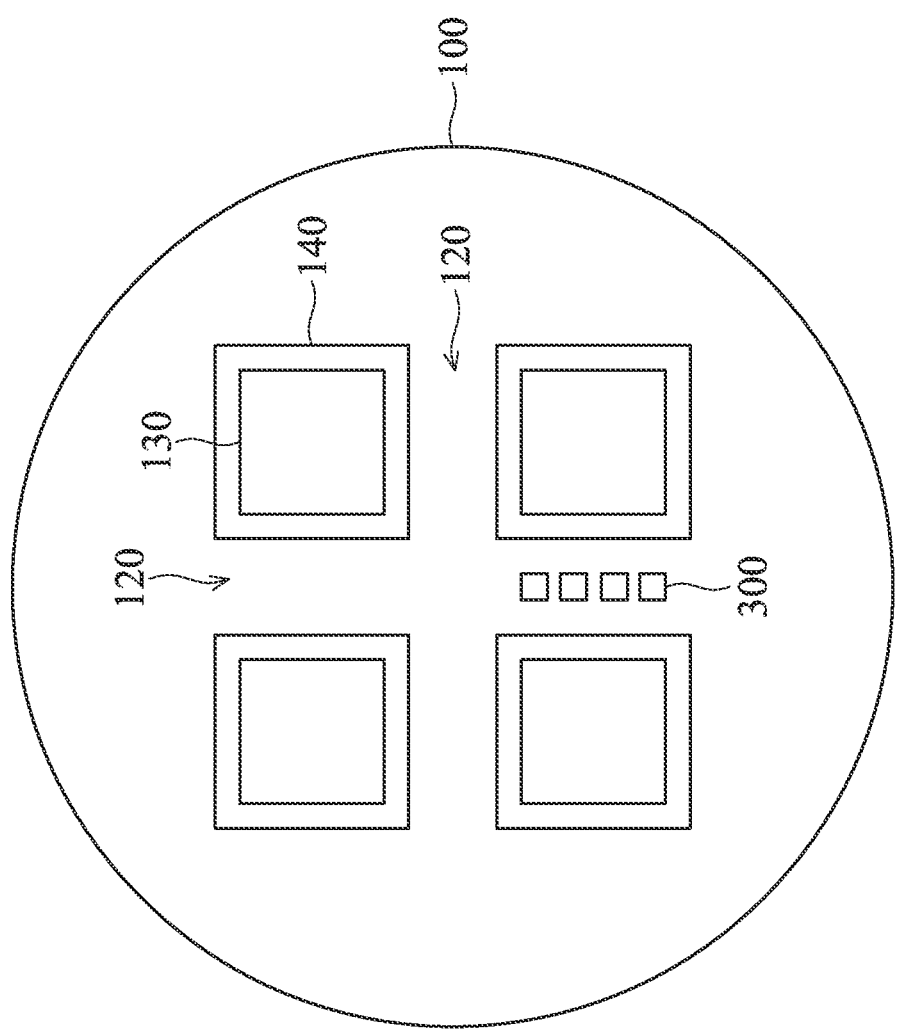
FIG. 1 shows a plan view of test structures (or test line structures) formed on a semiconductor wafer, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The manufacturing flow of the integrated circuit (IC) can be mainly divided into three stages, as follows: (1) the manufacturing of the semiconductor wafer, (2) the fabrication of the integrated circuit on the semiconductor wafer, and (3) the cutting, electric testing, sorting, and packaging of the integrated circuit. When fabricating the IC on the semiconductor wafer, the whole substrate is divided uniformly into many repetitive dies, and the adjacent dies are separated by scribe lines (or scraped lines).

After the IC fabricating process on a semiconductor wafer is finished but before the wafer is cut into dies, a wafer acceptance test (WAT) is conducted to derive the product yield. Prior to the wafer acceptance test, some test structures (i.e., test keys and test pads) electrically connected thereto have been formed in the scribe lines around a die. The test structures are electrically connected to an external circuit or probes of a probe card via the test pads to check the quality of the integrated circuit process in the wafer acceptance test. A device similar to a device formed in a die is also formed in the scribe line as a part of the test structure.

In semiconductor device manufacturing, test structure on a semiconductor wafer may be tested, for example, by physical failure analysis (PFA), to determine causes of certain defects that may exist in the dies. Defects may be related to many causes, including for example, flaws in the design of the die as well as flaws in the manufacturing processes used to manufacture the die.

Physical failure analysis (PFA) typically entails probing the wafer with a testing apparatus. By applying known electric test vectors and tracing the test vectors through the circuitry or test structure in the wafer, failure regions can be identified. Once a failure region is identified, additional steps such as manual net tracing are performed to determine a layer in which the failures occur. Next, PFA samples are selected, traditionally based on the judgment of engineers, and the physical samples are analyzed in a lab to pinpoint the cause of the failures. Next, a variety of procedures are performed, such as top lapping, cutting, cross-sectioning, etching, physical delayering, and the like, in order to diagnose the root cause of the failure.

FIG. 1 shows a plan view of test structures (or test line structures) 300 formed on a semiconductor wafer 100, in accordance with some embodiments of the disclosure. The semiconductor wafer 100 includes a number of scribe lines 120 between adjacent wafer dies 130. The test structures 300 are formed in the scribe lines 120. Each test structure 300 includes multiple testing pads, such as wafer acceptance test array pads and optical critical dimension (OCD) pads. In some embodiments, each die 130 includes a die seal ring 140 so that when the semiconductor wafer 100 is provided to assembly, each die is accordingly protected.

The scribe line 120 is formed on the exterior side of the dies 130 and the die seal rings 140 and surrounds the entire die seal ring 140. The die seal ring 140 are formed between the dies 130 and the scribe line 120, such that the die seal ring 140 could be used as a blocking wall for protecting the dies 130 from external stress while the semiconductor wafer is diced. The cutting operation is performed by using a cutter to cut the semiconductor wafer 100 into individual dies 130 along the scribe lines 120.

In order to evaluate the efficiency of each procedure and to confirm the performance of the devices after the procedures, a wafer acceptance test (WAT) is performed on the wafers. The wafer acceptance test includes electrical tests on the pads formed around the peripheral regions of the devices, e.g., the scribe line 120 of FIG. 1. The main purposes of the wafer acceptance test are to confirm the stability of the semiconductor process as well as to enhance the yield of devices. By means of the wafer acceptance test, the quality and the stability of the wafers are somewhat ensured.

Figure 2:
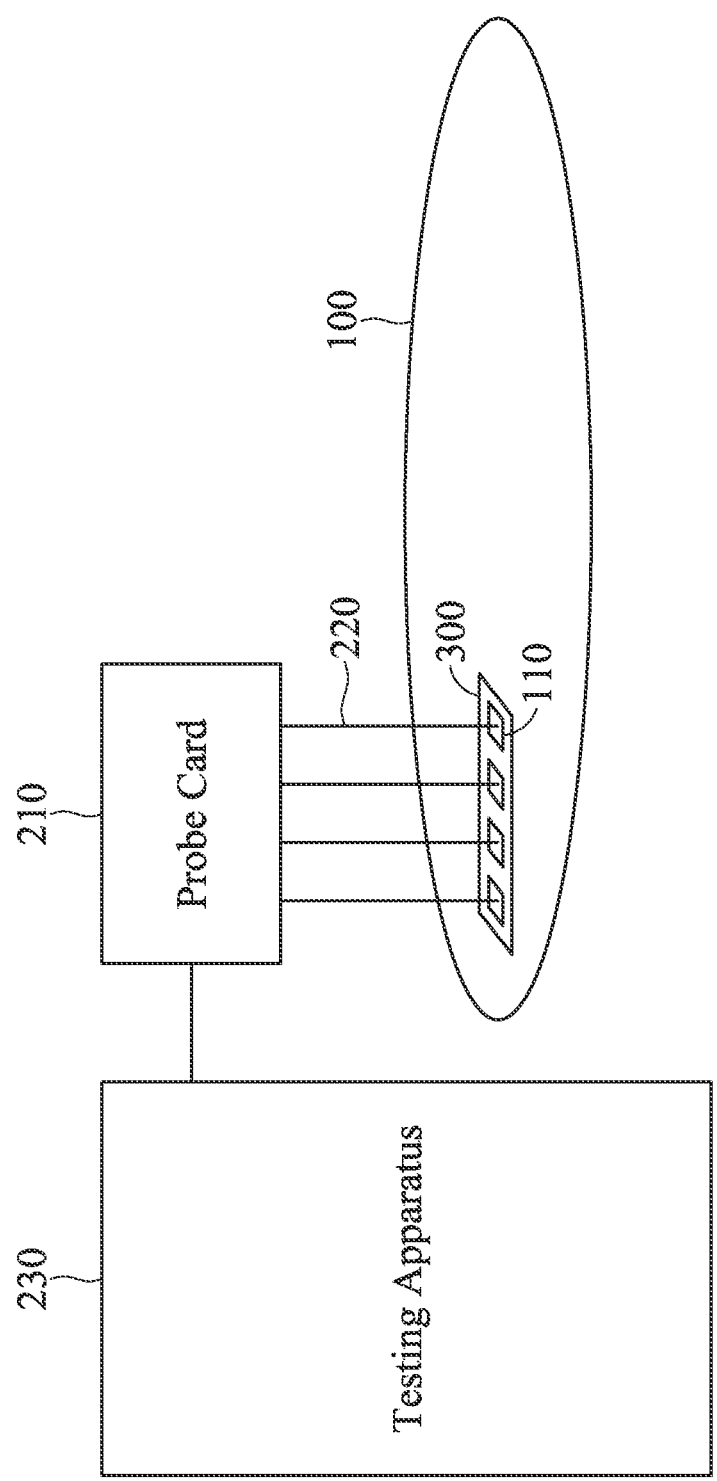
FIG. 2 shows an example illustrating a wafer acceptance test for a semiconductor wafer of FIG. 1, in accordance with some embodiments of the disclosure.

FIG. 2 shows an example illustrating a wafer acceptance test for a semiconductor wafer 100 of FIG. 1, in accordance with some embodiments of the disclosure. In FIG. 2, a probe card 210 is used to perform a wafer acceptance test (or failure mode analysis). The probe card 210 includes a number of probes 220. It should be understood that there are many types of probes 220, such as electrical probe pins, optical probes, and/or magnetic probes. The probes 220 of the probe card 210 are made contact with the test pads 110 of the test structure 300, and the positions of the test pads 110 of the test structure 300 have to be identified first. After the probes 220 of the probe card 210 contact the test pads 110 of the test structure 300, the probe card 210 sequentially and repeatedly applies test signals to the test structure 300 through the probes 220, and then receives responses from the test structure 300 through the probes 220. The probe card 210 is usually connected to a testing apparatus (or a tester) 230, and the testing apparatus 230 can perform various test programs and record the test results of the semiconductor wafer 100. In a Back End of Line (BEOL) test, the test structure 300 can provide process stability on various parameters. Upon finishing the tests, failed dies are inked and/or faulty process results are identified via the testing apparatus 230. The semiconductor wafer 100 is then diced along the scribe lines 120. Therefore, integrated circuit devices (dies) are created.

In some embodiments, the semiconductor wafer 100 uses a metal structure for interconnecting circuitry on the various wafer dies 130. The metal structure includes a number of metal layers, separated by one or more layers of interlayer dielectric. For each layer, a dielectric layer is etched with a pattern, copper is deposited over the patterned dielectric layer, and a top portion of the deposited copper is removed by a chemical mechanical planarization (CMP) process. The overall process can be used to not only make the metal interconnects, but a dual damascene process can be used to make vias and other interlayer connections. It should be understood that the various layers can be of other materials, such as copper alloy and/or aluminum.

Figure 3A:
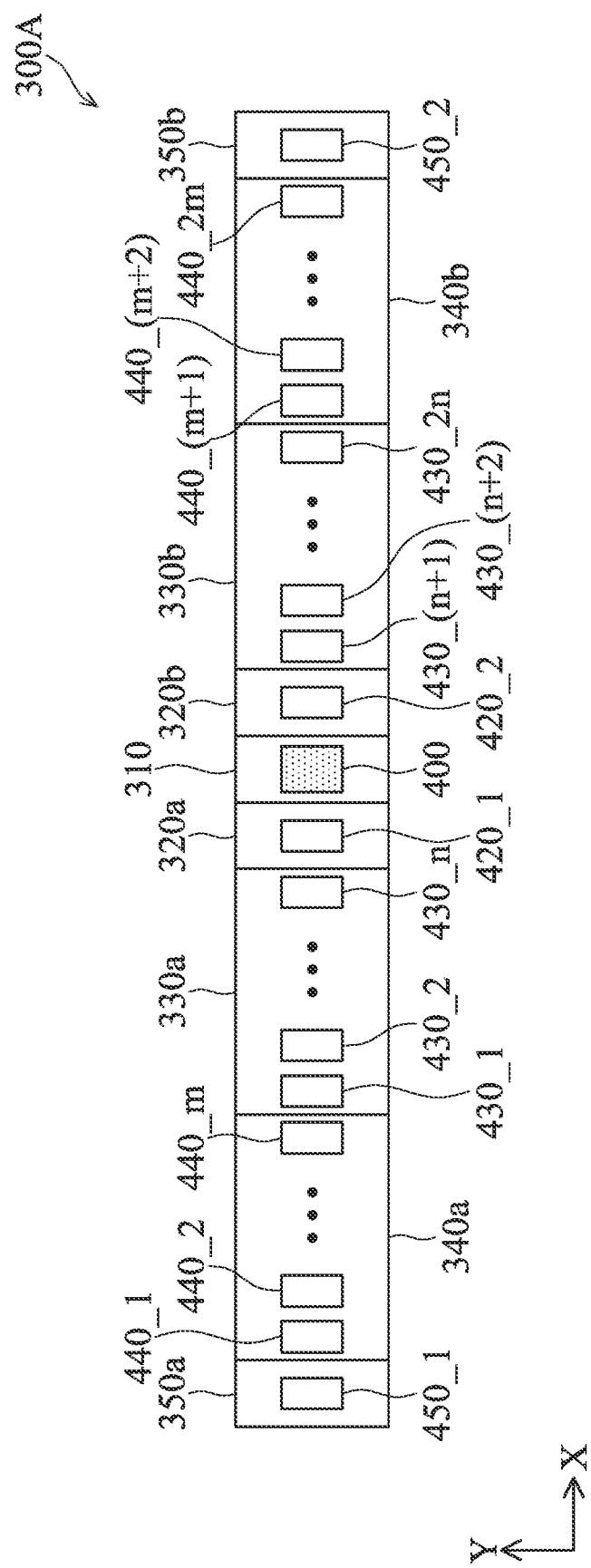
FIG. 3A shows a schematic illustrating a test structure, in accordance with some embodiments of the disclosure.

FIG. 3A shows a schematic illustrating a test structure 300A, in accordance with some embodiments of the disclosure. The test structure 300A includes a cell region 310, the output regions 320a and 320b, the input regions 330a and 330b, the input regions 340a and 340b, and the well input regions 350a and 350b arranged in a line in the X-direction.

The cell region 310 includes a test array 400, and the test array 400 is a high-density test array includes multiple cells under test. In some embodiments, the cells in the test array 400 have the same circuit configurations. In some embodiments, the cells in the test array 400 are divided into multiple groups, and the cells in each group have the same circuit configuration. In some embodiments, each cell under test includes one or more devices to be test in a memory cell.

In the test structure 300A, the output result of the test array 400 is provided to a tester (e.g., the testing apparatus 230 of FIG. 2) through the test pads in the output regions 320a and 320b. In such embodiment, the output region 320a includes the output pad 420_1, and the output region 320b includes the output pad 420_2. The output pad 420_1 is configured to provide the test result of half of the cells in the test array 400, and the output pad 420_2 is configured to provide the test result of the remaining cells in the test array 400. In the X-direction, the output regions 320a and 320b are disposed on opposite sides of the test array 400.

The test pads in the input regions 330a and 330b are configured to provide the input signals (or called word-lines) WL from the tester to the test array 400. The input region 330a includes the input pads 430_1 through 430_n, and the input region 330b includes the input pads 430_(n+1) through 430_2n. Furthermore, the pad number of the input pads of the input regions 330a and 330b are the same. In some embodiments, the pad number of the input pads of the input regions 330a and 330b are different.

The test pads in the input regions 340a and 340b are configured to provide the input signals (or calls bit-lines) BL from the tester to the test array 400. The input region 340a includes the input pads 440_1 through 440_m, and the input region 340b includes the input pads 440_(m+1) through 440_2m. Furthermore, the pad number of the input pads of the input regions 340a and 340b are the same. In some embodiments, the pad number of the input pads of the input regions 340a and 340b are different. In some embodiments, the positions of the well regions 340a and 340b and the positions of the well regions 330a and 330b may be interchanged.

The test array 400 is formed over at least one well region of the semiconductor wafer 100. The well input regions 350a and 350b are configured to provide the well signals from the tester to the well region of the test array 400. The well input region 350a includes the input pad 450_1, and the well input region 350b includes the input pad 450_2. In the test structure 300A, the well input regions 350a and 350b are arranged at the outermost. In some embodiments, the well input regions 350a and 350b are arranged close to the cell region 310. For example, the well input region 350a may be arranged between the input regions 330a and 340a, between the input region 330a and the output region 320a, or between the output region 320a and the cell region 310.

Total number of the input pads (e.g., 2m) of the input regions 340a and 340b and total number of the input pads (e.g., 2n) of the input regions 330a and 330b are determined according to the number of cells under test in the test array 400. In some embodiments, the total number of the input pads of the input regions 330a and 330b is equal to the number of rows in the test array 400, and the total number of the input pads of the input regions 340a and 340b is equal to the number of columns in the test array 400. In some embodiments, the total number of the input pads of the input regions 330a and 330b is equal to the number of columns in the test array 400, and the total number of the input pads of the input regions 340a and 340b is equal to the number of rows in the test array 400.

Figure 3B:
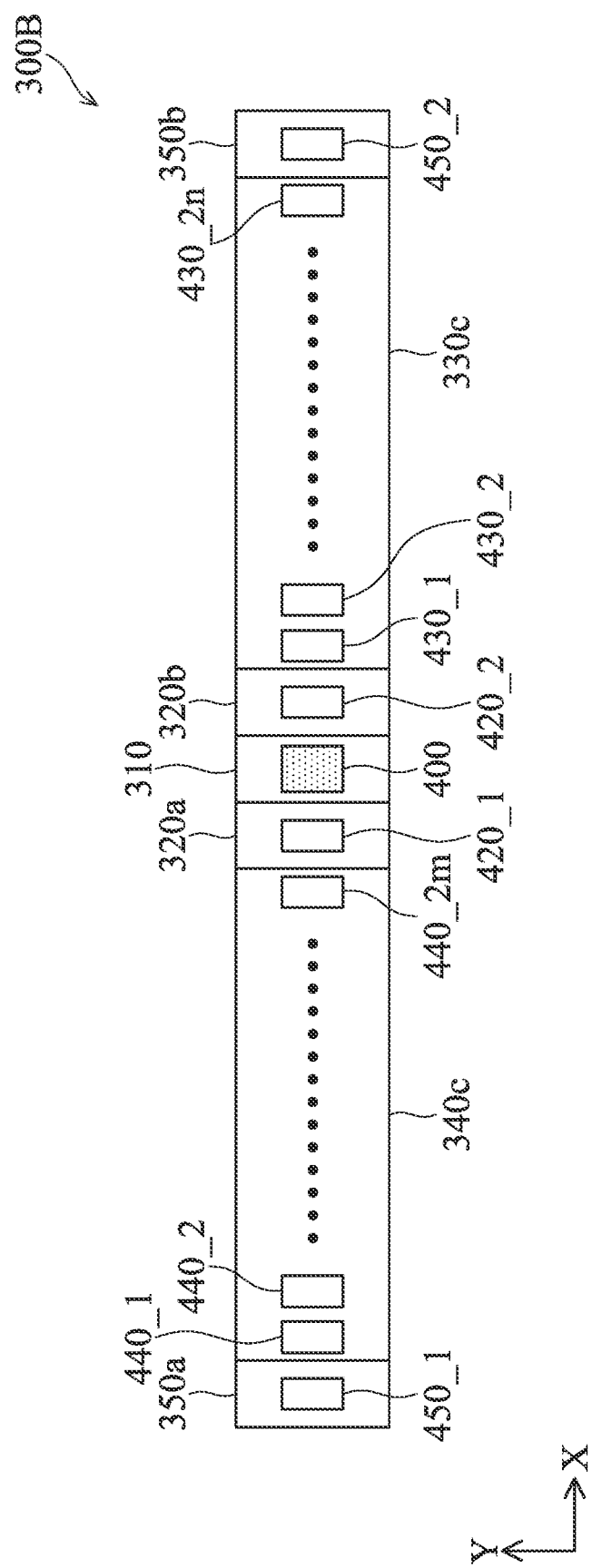
FIG. 3B shows a schematic illustrating a test structure, in accordance with some embodiments of the disclosure.

In some embodiments, the input regions 330a and 330b are combined into one input region, and the input regions 340a and 340b are combined into another input region, as shown in FIG. 3B. FIG. 3B shows a schematic illustrating a test structure 300B, in accordance with some embodiments of the disclosure. The test structure 300B includes a cell region 310, the output regions 320a and 320b, the input region 330c, the input region 340c, and the well input regions 350a and 350b arranged in a line in the X-direction. In the X-direction, the input regions 330c and 340c are disposed on opposite sides of the test array 400.

The test pads in the input region 330c are configured to provide the input signals WL from the tester to the test array 400. The input region 330c includes the input pads 430_1 through 430_2n. Furthermore, the test pads in the input region 340c is configured to provide the input signals BL from the tester to the test array 400. The input region 340c includes the input pads 440_1 through 440_2m.

Similarly, the output regions 320a and 320b may be combined into one output region. Furthermore, the well input regions 350a and 350b may be combined into one well input region.

Figure 4:
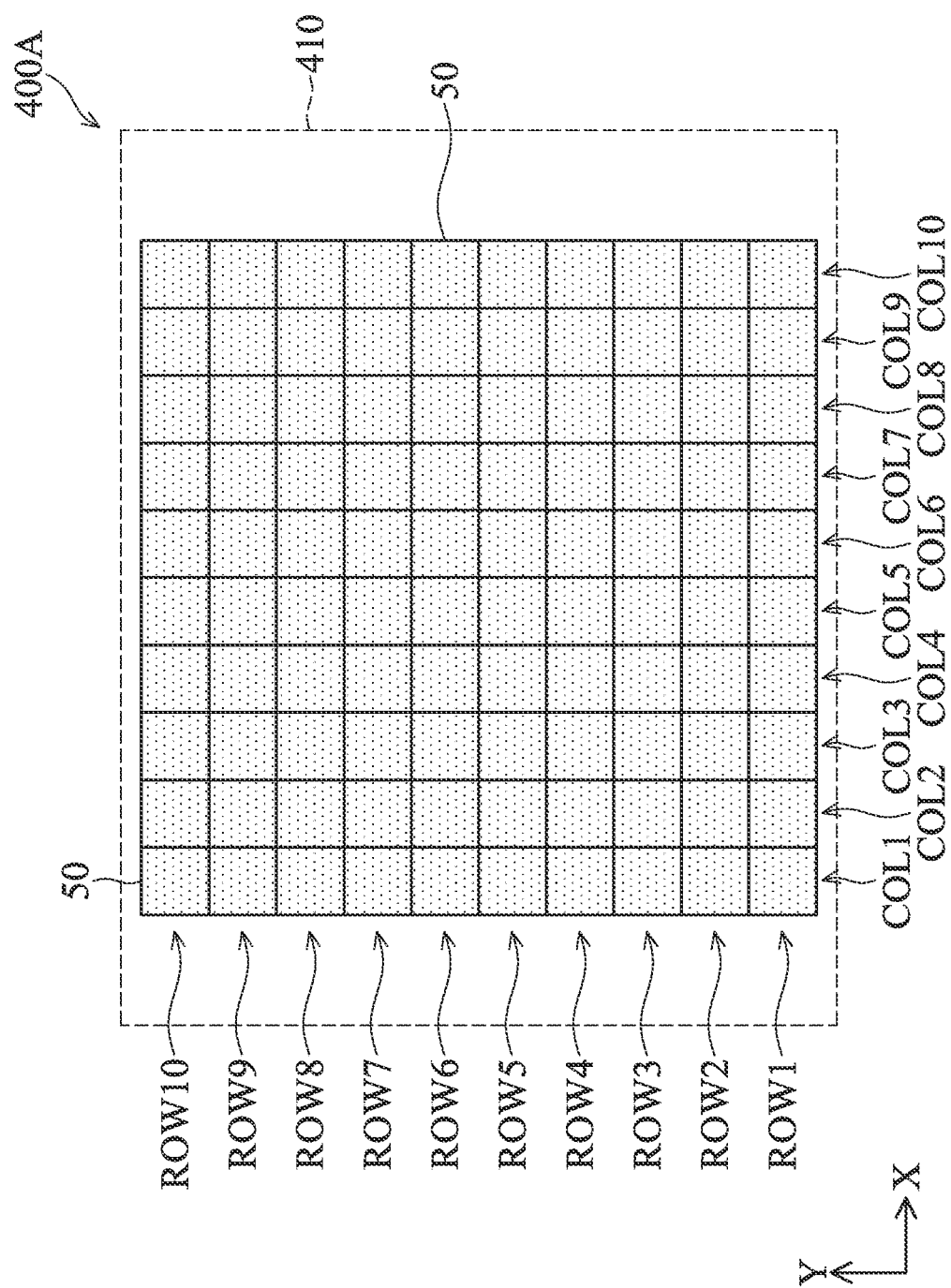
FIG. 4 shows a test array, in accordance with some embodiments of the disclosure.

FIG. 4 shows a test array 400A, in accordance with some embodiments of the disclosure. In FIG. 4, the test array 400A is formed over the well region 410. The test array 400A includes 10×10 cells 50, and the cells 50 are arranged in the rows ROW1 through ROW10 and the columns COL1 through COL10. In some embodiments, the cells 50 in the test array 400A have the same circuit configuration. The cell 50 includes at least one transistor to be tested.

Figure 5:
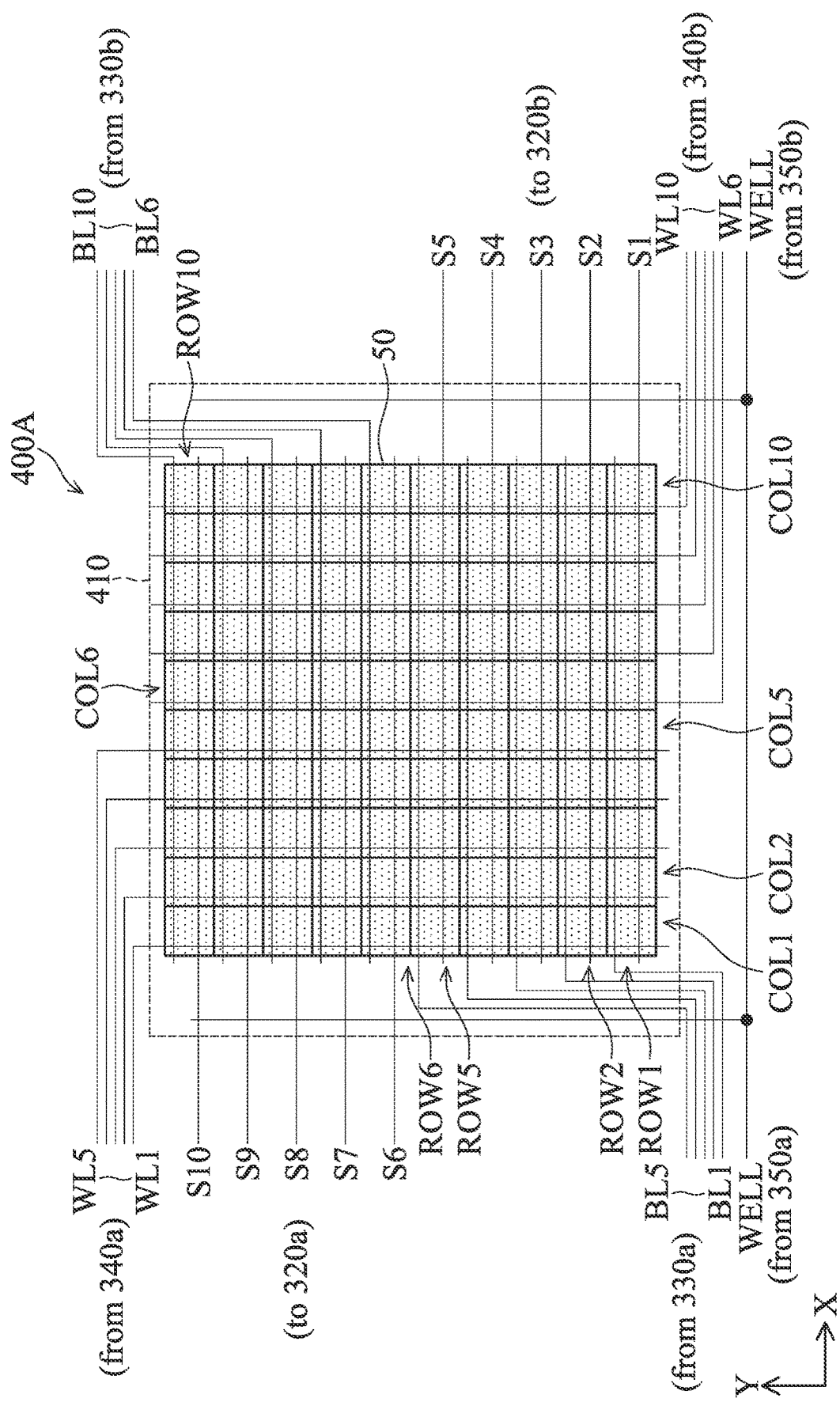
FIG. 5 shows the connection configuration of the test array of FIG. 4, in accordance with some embodiments of the disclosure.

FIG. 5 shows the connection configuration of the test array 400A of FIG. 4, in accordance with some embodiments of the disclosure. The signal line WELL from the well input regions 350a and 350b is coupled to the well region 410, and is configured to apply a well voltage from the input pad 450_1 of the well input region 350a and the input pad 450_2 of the well input region 350b to the well region 410 for the cells 50 of the test array 400A. In the test array 400A, the number of the cells 50 is equal to the number of the signal lines WL1 through WL10 multiplied by the number of the signal lines BL1 through BL10.

Referring to FIG. 3A and FIG. 5 together and assuming that m and n are both equal to five (i.e., m=n=5), the total the total number of the input pads of the input regions 340a and 340b of FIG. 3A is equal to the number of columns COL1 through COL10 in the test array 400A, i.e., 2m=10. Furthermore, the total number of the input pads of the input regions 330a and 330b of FIG. 3A is equal to the number of rows in the test array 400A, i.e., 2n=10.

The signal lines WL1 through WL5 from the input pads 440_1 through 440_5 of the input region 340a are coupled to the cells 50 of the columns COL1 through COL5 in the test array 400A, respectively. For example, the signal line WL1 is configured to couple the cells 50 in the column COL1 to the input pad 440_1, and the signal line WL5 is configured to couple the cells 50 in the column COL5 to the input pad 440_5. Furthermore, the signal lines WL6 through WL10 from the input pads 440_6 through 440_10 of the input region 340b are coupled to the cells 50 of the columns COL6 through COL10 in the test array 400A, respectively. For example, the signal line WL6 is configured to couple the cells 50 in the column COL6 to the input pad 440b, and the signal line WL10 is configured to couple the cells 50 in the column COL10 to the input pad 440_10.

The signal lines BL1 through BL5 from the input pads 430_1 through 430_5 of the input region 330a are coupled to the cells 50 of the rows ROW1 through ROW5 in the test array 400A, respectively. For example, the signal line BL1 is configured to couple the cells 50 in the row ROW1 to the input pad 430l, and the signal line BL5 is configured to couple the cells 50 in the row ROW5 to the input pad 430_5. Furthermore, the signal lines BL6 through BL10 from the input pads 430_6 through 430_10 of the input region 330b are coupled to the cells 50 of the rows ROW6 through ROW10 in the test array 400A, respectively. For example, the signal line BL6 is configured to couple the cells 50 in the row ROW6 to the input pad 430_6, and the signal line BL10 is configured to couple the cells 50 in the row ROW10 to the input pad 430_10.

In the test array 400A, by driving one of the signal lines BL1 through BL10 and one of the signal line WL1 through WL10, the cells 50 under test are measured one after the other. The detailed test operation will be described later.

The signal lines S1 through S5 are coupled between the output pad 420_2 of the output region 320b and the cells 50 of the rows ROW1 through ROW5 in the test array 400A, respectively. For example, the signal line S1 is configured to couple the cells 50 in the row ROW1 to the output pad 420_2, so as to provide the test results of the cells 50 of the row ROW1 to the output pad 420_2 of the output region 320b. Moreover, the signal lines S6 through S10 are coupled between the output pad 420_1 of the output region 320a and the cells 50 of the rows ROW6 through ROW10 in the test array 400A, respectively. For example, the signal line S10 is configured to couple the cells 50 in the row ROW10 to the output pad 420l, so as to provide the test results of the cells 50 of the row ROW10 to the output pad 420_1 of the output region 320a.

Figure 6:
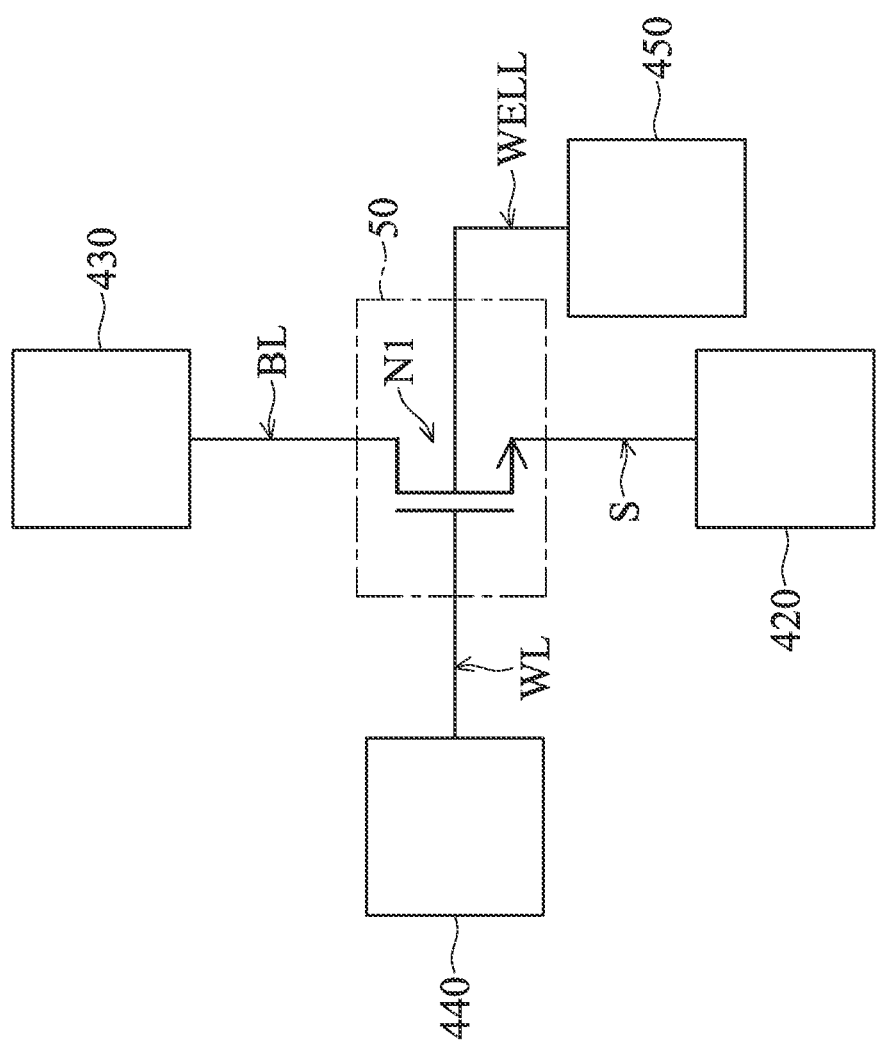
FIG. 6 shows the schematic illustrating the cell under test, in accordance with some embodiments of the disclosure.

FIG. 6 shows the schematic illustrating the cell 50 under test, in accordance with some embodiments of the disclosure. In such embodiment, the cell 50 includes an N-type transistor N1 formed over a P-well region. The N-type transistor N1 is selected from a group consisting of planar structure, FINFET structure, vertical gate all around (GAA), horizontal GAA, nano wire, nano sheet, or a combination thereof. As described above, the cells 50A in the test array 400A have the same circuit configuration. In some embodiments, the N-type transistor N1 may be implemented as the pull-down transistor PD or the pass-gate transistor PG in the SRAM cell. In other words, by measuring the cell 50A to analyze the characteristics of the pull-down transistor PD or the pass-gate transistor PG of the SRAM cell.

In some embodiments, the cell 50 includes a P-type transistor formed over an N-well region. The P-type transistor may be selected from a group consisting of planar structure, FINFET structure, vertical gate all around (GAA), horizontal GAA, nano wire, nano sheet, or a combination thereof. In some embodiments, the P-type transistor may be implemented as the pull-up transistor PU.

In FIG. 6, a drain of the N-type transistor N1 is coupled to the corresponding input pad 430 through the corresponding signal line BL. A gate of the N-type transistor N1 is coupled to the corresponding input pad 410 through the corresponding signal line WL. A bulk of the N-type transistor N1 is formed in the well region 410, and the bulk of the N-type transistor N1 is coupled to the corresponding input pad 450 through the signal line WELL. A source of the N-type transistor N1 is coupled to the corresponding output pad 420 through the corresponding signal line S.

Referring to FIG. 5 and FIG. 6 together and assuming the cell 50A of FIG. 6 is located in the row ROW2 and the column COL1 of the test array 400A, the drain of the N-type transistor N1 is coupled to the input pad 430_2 of the input region 330a through the signal line BL2. Moreover, the gate of the N-type transistor N1 is coupled to the input pad 440_1 of the input region 340a through the signal line WL1. The bulk of the N-type transistor N1 is coupled to the input pad 450_1 of the well input region 350a and the input pad 450_2 of the well input region 350b through the signal line WELL. The source of the N-type transistor N1 is coupled to the output pad 420_2 of the output region 320b through the signal line S2.

When the test array 400A is tested, the tester is configured to apply a low voltage (e.g., a grounding signal, a low logic level "L" or a VSS signal) to the signal line WELL through the input pads 450_1 and 450_2. Furthermore, the tester is configured to sequentially drive each of the signal lines WL1 through WL10 and each of the signal lines BL1 through BL10, so as to test each cell 50 of the test array 400A in sequence. In other words, the tester is configured to individually drive the signal lines WL1 through WL10 and individually drive the signal lines BL1 through BL10 under testing the test array 400A, so as to measure the result of the cell 50 corresponding to the driven signal line BL and the driven signal line WL.

For example, if the tester want to test the cell 50A located in the row ROW2 and the column COL1 of the test array 400A, the tester is configured to apply a high voltage (e.g., a high logic level "H" or a VDD signal) to drive the signal line WL1 through the input pad 440_1 and apply a low voltage (e.g., a grounding signal, a low logic level "L" or a VSS signal) to the signal lines WL2 through WL10 via the input pads 440_2 through 440_10. Simultaneously, the tester is configured to apply a high voltage (e.g., a high logic level "H" or a VDD signal) to drive the signal line BL through the input pad 430_2 and apply a low voltage (e.g., a grounding signal, a low logic level "L" or a VSS signal) to the signal lines BL1 and BL3 through BL10 via the input pads 430_1 and 430_3 through 430_10. Therefore, the cell 50A located in the row ROW2 and the column COL1 is turned on (hereinafter referred to as the turned-on cell), and other cells 50A located in the test array 400A are turned off (hereinafter referred to as the turned-off cells).

If the cells 50A of the test array 400A are normal, the tester only obtains (or measures) the current flowing through the turned-on cell 50A through the signal line S2 and the output pad 420_2. If any cell 50A of the test array 400A sharing the same signal line WL or BL is abnormal, in addition to the current flowing through the turned-on cell 50A, the tester further obtains the other current caused by the turned-off abnormal cell 50A through the signal line S2 and the output pad 420_2.

Figure 7A:
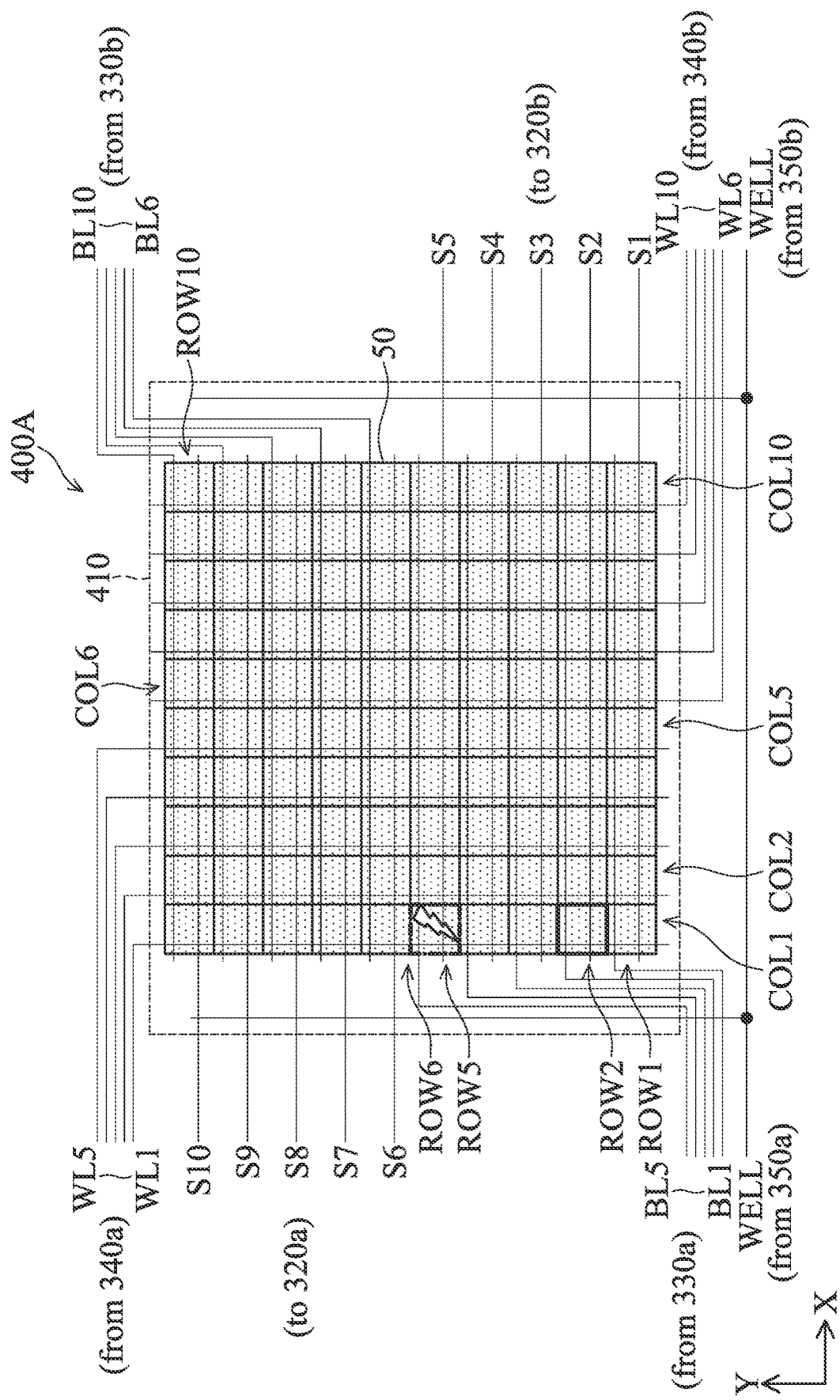
FIG. 7A shows a schematic illustrating an abnormal cell (or a failure cell) in the test array of FIG. 5, in accordance with some embodiments of the disclosure.

FIG. 7A shows a schematic illustrating an abnormal cell (or a failure cell) in the test array 400A of FIG. 5, in accordance with some embodiments of the disclosure. In FIG. 7A, assuming that the cell 50A located in the row ROW5 and the column COL1 of the test array 400A is the abnormal cell, and a gate-to-source short state is present in the abnormal cell. Furthermore, no source-to-drain short issue is present in the abnormal cell.

When the cell 50A located in the row ROW2 and the column COL1 of the test array 400A is measured, the signal line WL1 and the signal line BL2 are driven by the tester, and the tester may obtain the current flowing through the turned-on cell 50A and the short current from the abnormal cell (i.e., the off-current) through the signal line S5 from the output pad 420_2. In some embodiments, the tester is configured to ground the output pad 420_2 so as to collect the current from the test array 400A.

Similarly, when other cell 50A located in the same column (i.e., the column COL1) and coupled to the same output pad (i.e., the output pad 420_2) is tested, the tester may also obtain the current flowing through the turned-on cell 50A and the short current from the abnormal cell through the output pad 420_2. Therefore, when the cells 50A located in the same column COL1 and the different rows are measured, the tester may obtain the same current (i.e., the current flowing through the turned-on cell plus the short current from the abnormal cell).

Figure 7B:
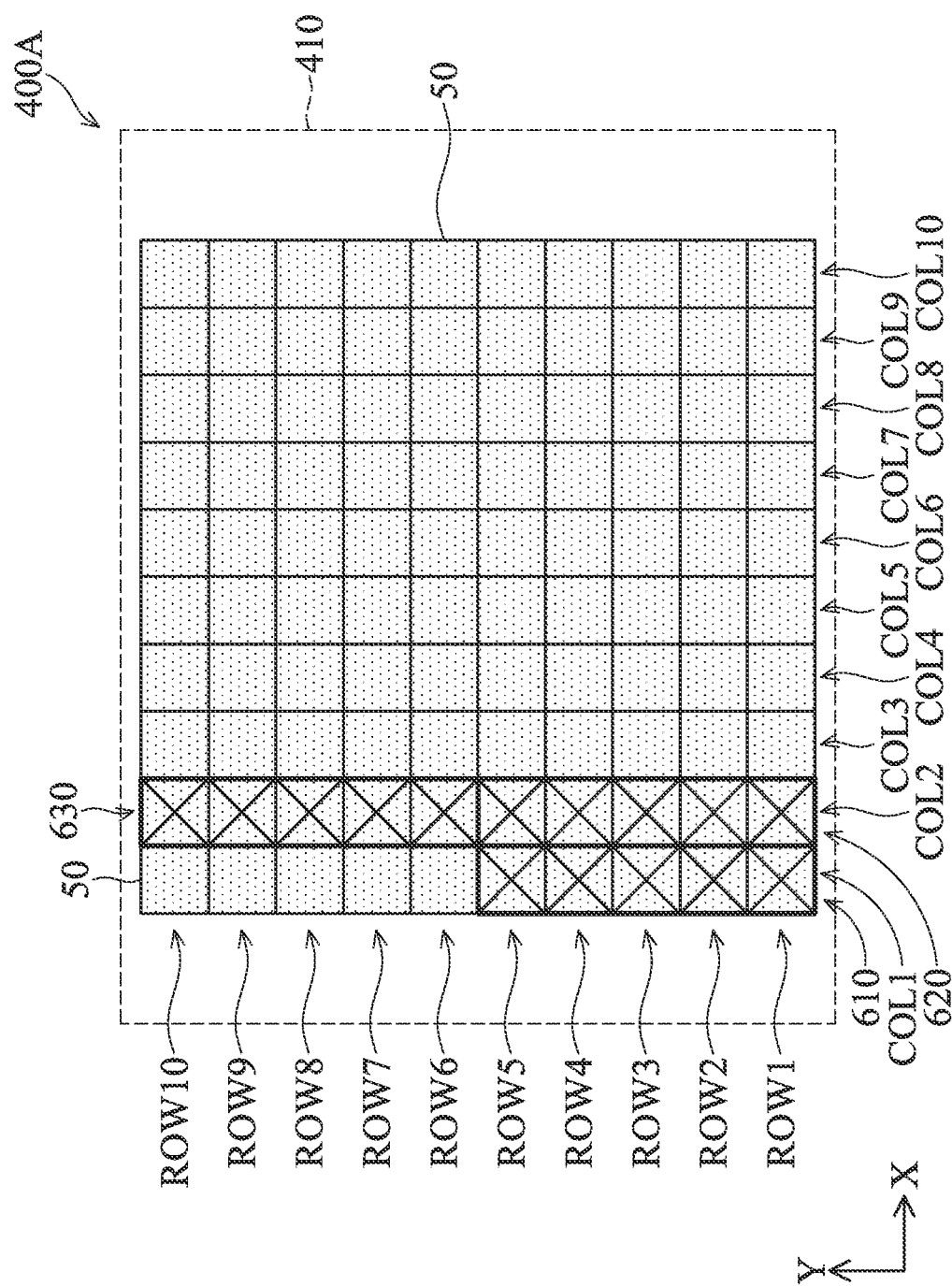
FIG. 7B shows the measurement result in the test array of FIG. 5, in accordance with some embodiments of the disclosure.

As shown in FIG. 7B, FIG. 7B shows the measurement result in the test array 400A of FIG. 5, in accordance with some embodiments of the disclosure. The vertical cell groups 610, 620 and 630 are shown in the Y-direction in FIG. 7B.

The vertical cell group 610 includes the cells 50 located in the column COL1 and the rows ROW1 through ROW5 that are coupled to the same output pad (e.g., the output pad 420_2), and the tester obtains the same measured current for each cell 50 of the vertical cell group 610. Therefore, the tester determines that the gate-to-source short state happens in one of the cells 50 of the vertical cell group 610. In such embodiment, no source-to-drain short state is present in the vertical cell group 610.

The vertical cell group 620 includes the cells 50 located in the column COL2 and the rows ROW1 through ROW5 that are coupled to the same output pad (e.g., the output pad 420_2), and the tester obtains the same measured current for each cell 50 of the vertical cell group 620.

The vertical cell group 630 includes the cells 50 located in the column COL2 and the rows ROW6 through ROW10 that are coupled to the same output pad (e.g., the output pad 420_1), and the tester obtains the same measured current for each cell 50 of the vertical cell group 630. Similarly, each of the vertical cell groups 620 and 630 includes at least one abnormal cell having the gate-to-source short state without source-to-drain short state.

After measuring the test array 400A and obtaining the vertical cell groups 610 through 630 and other abnormal cells in the test array 400A, the tester can obtain the precise locations of the abnormal cells on the wafer, so as to perform the subsequent procedures for physical failure analysis (PFA) based on the precise locations of the abnormal cells.

Figure 8A:
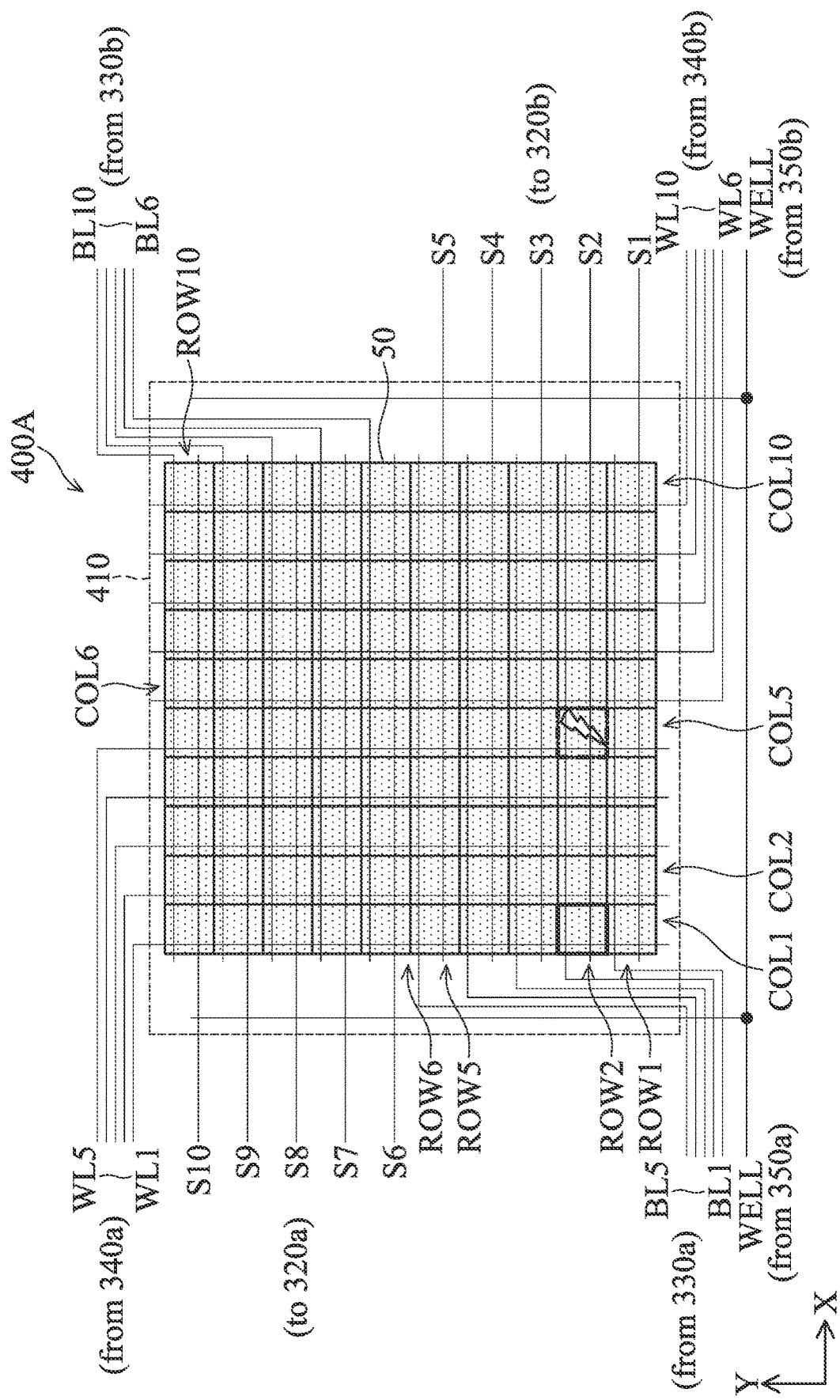
FIG. 8A shows a schematic illustrating an abnormal cell in the test array of FIG. 5, in accordance with some embodiments of the disclosure.

FIG. 8A shows a schematic illustrating an abnormal cell in the test array 400A of FIG. 5, in accordance with some embodiments of the disclosure. In FIG. 8A, assuming that the cell 50A located in the row ROW2 and the column COL5 of the test array 400A is the abnormal cell, and a source-to-drain short state is present in the abnormal cell. Furthermore, no source-to-gate short issue is present in the abnormal cell.

When the cell 50A located in the row ROW2 and the column COL1 of the test array 400A is measured, the signal line WL1 and the signal line BL2 are driven by the tester, and the tester may obtain the current flowing through the turned-on cell 50A and the short current from the abnormal cell through the signal line S2 from the output pad 420_2. In some embodiments, the tester is configured to ground the output pad 420_2 so as to collect the current from the test array 400A.

Similarly, when other cell 50A located in the same row (i.e., the row ROW2) is tested, the tester may also obtain the current flowing through the turned-on cell 50A and the short current from the abnormal cell through the signal line S2 and the output pad 420_2. Therefore, when the cells 50A located in the same row ROW2 and the different columns are measured, the tester may obtain the same current (i.e., the current flowing through the turned-on cell plus the short current from the abnormal cell).

Figure 8B:
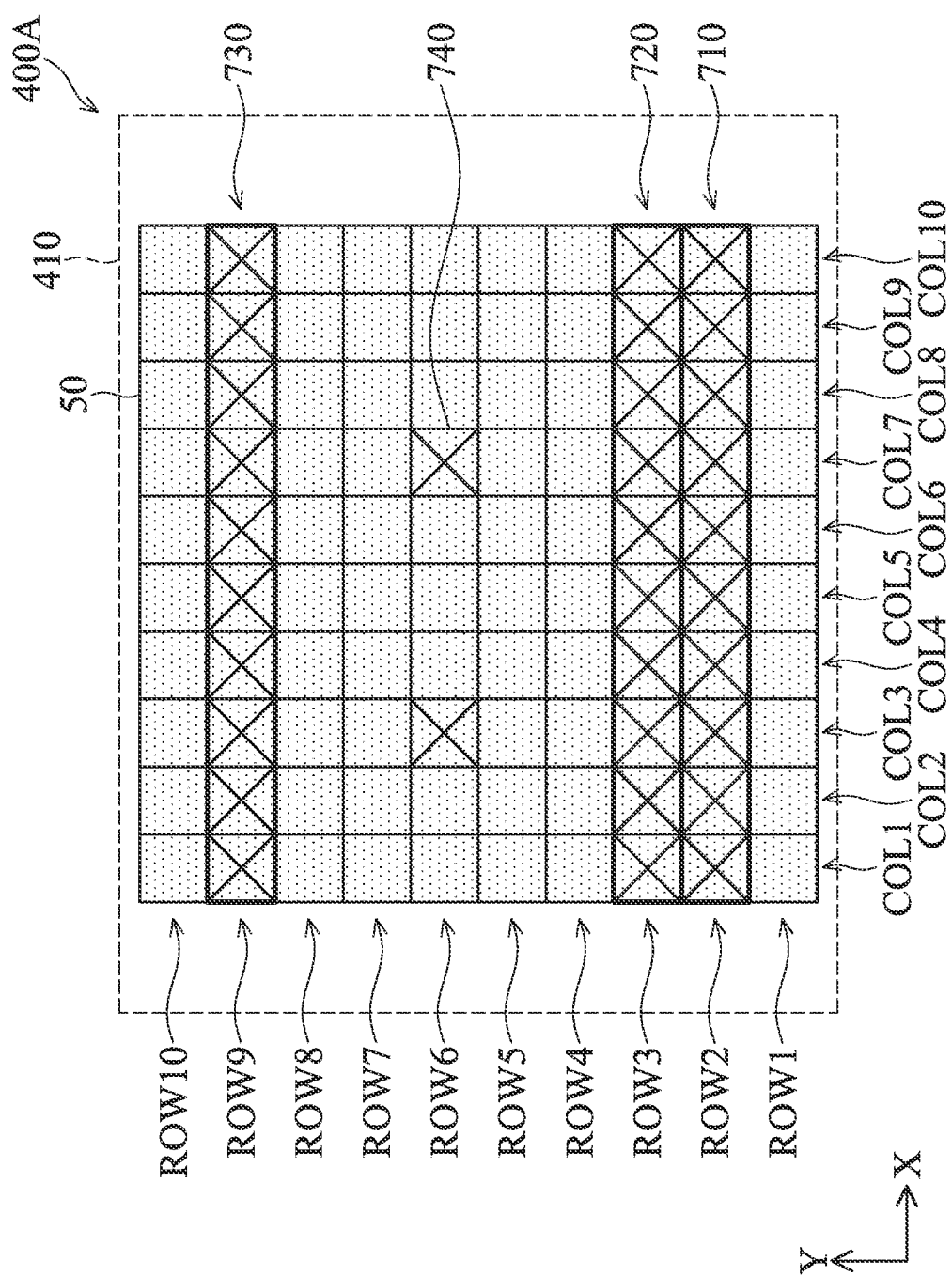
FIG. 8B shows the measurement result in the test array of FIG. 5, in accordance with some embodiments of the disclosure.

As shown in FIG. 8B, FIG. 8B shows the measurement result in the test array 400A of FIG. 5, in accordance with some embodiments of the disclosure. The horizontal cell groups 710, 720 and 730 are shown in the X-direction in FIG. 8B.

The vertical cell group 710 includes the cells 50 located in the row ROW2 and the columns COL1 through ROW10 that are coupled to the same output pad (e.g., the output pad 4202), and the tester obtains the same measured current for each cell 50 of the horizontal cell group 710. Therefore, the tester determines that the source-to-drain short state happens in one of the cells 50 of the horizontal cell group 710. In such embodiment, no source-to-gate short state is present in the horizontal cell group 710.

The horizontal cell group 720 includes the cells 50 located in the row ROW3 and the columns COL1 through COL10 that are coupled to the same output pad (e.g., the output pad 420_2), and the tester obtains the same measured current for each cell 50 of the horizontal cell group 720.

The horizontal cell group 730 includes the cells 50 located in the row ROW9 and the columns COL1 through COL10 that are coupled to the same output pad (e.g., the output pad 420_1), and the tester obtains the same measured current for each cell 50 of the horizontal cell group 730. Similarly, each of the horizontal cell groups 720 and 730 includes at least one abnormal cell having the source-to-drain short state without source-to-gate short state.

After measuring the test array 400A and obtaining the horizontal cell groups 710 through 730 and other abnormal cells 740 in the test array 400A, the tester can obtain the precise locations of the abnormal cells on the wafer, so as to perform the subsequent procedures for PFA based on the precise locations of the abnormal cells.

Figure 9:
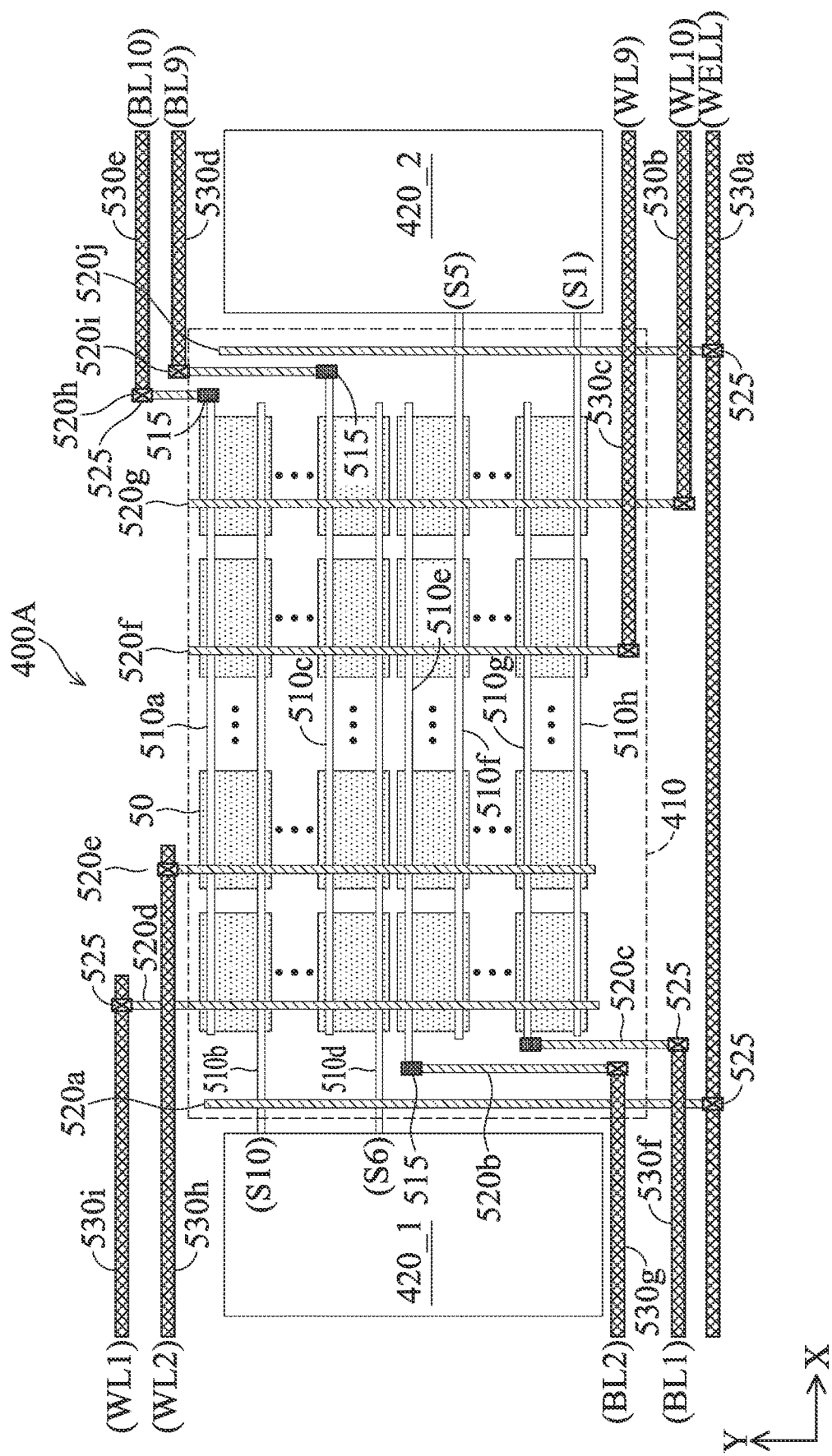
FIG. 9 shows a layout of the test array of FIG. 5, in accordance with some embodiments of the disclosure.

FIG. 9 shows a layout of the test array 400A of FIG. 5, in accordance with some embodiments of the disclosure. In FIG. 9, the test array 400A is formed over the well region 410 and between the output pads 420_1 and 420_2. In order to simplify the description, FIG. 9 only depicts a part of the signal lines WL, BL and S.

The signal lines S6 through S10 are coupled to the output pad 420_1 of FIG. 3A. The signal line S6 is formed by a conductive wire 510d, and the signal line S10 is formed by a conductive wire 510b. The conductive wires 510d and 510d extends along the X-direction and formed in a first metal layer M1. The signal lines S1 through S5 are coupled to the output pad 420_2 of FIG. 3A. The signal line S1 is formed by a conductive wire 510h and the signal line S5 is formed by a conductive wire 510f. The conductive wires 510h and 510f extends along the X-direction and are formed in the first metal layer M1.

In some embodiments, the first metal layer M1 is the lowest metal layer. The output pads 420_1 and 420_2 are formed by the electrodes in the first metal layer M1. The electrodes of the output pads 420_1 and 420_2 are coupled to the top electrodes of the top metal layer (not shown) through the interconnect structures (not shown). Therefore, the tester can use the probes of the probe card to contact the top electrodes of the output pads 420_1 and 420_2 to measure the current of the test array 400A.

The signal line WELL is configured to couple the input pads 450_1 and 450_2 of FIG. 3A to the well region 410 of the test array 400A. The signal line WELL is formed by the conductive wire 530a, the conductive wires 520a and 520j and the vias 525 between the conductive wire 530a and the conductive wires 520a and 520j. The conductive wires 520a and 520j extend along the Y-direction and are formed in a second metal layer M2, and the second metal layer M2 is formed over the first metal layer M1. The conductive wires 520a and 520j are coupled to the well region 410 through the underlying interconnect structures (not shown). The conductive wire 530a extends along the X-direction and is formed in a third metal layer M3, and the third metal layer M3 is formed over the second metal layer M2.

The signal lines WL1 and WL2 are coupled to the input pads in the input region 340a of FIG. 3A. The signal line WL1 is formed by a conductive wire 530i, a conductive wire 520d and the via 525 between the conductive wires 530i and 520d. The signal line WL2 is formed by a conductive wire 530h, a conductive wire 520e and the via 525 between the conductive wires 530h and 520e. The conductive wires 520d and 520e extend along the Y-direction and are formed in the second metal layer M2. The conductive wires 530i and 530h extend along the X-direction and are formed in the third metal layer M3.

The signal lines WL9 and WL10 are coupled to the input pads in the input region 340b of FIG. 3A. The signal line WL10 is formed by a conductive wire 530b, a conductive wire 520g and the via 525 between the conductive wires 530b and 520g. The signal line WL9 is formed by a conductive wire 530c, a conductive wire 520f and the via 525 between the conductive wires 530c and 520f. The conductive wires 520f and 520g extend along the Y-direction and are formed in the second metal layer M2. The conductive wires 530c and 530b extend along the X-direction and are formed in the third metal layer M3.

The signal lines BL1 and BL2 are coupled to the input pads in the input region 330a of FIG. 3A. The signal line BL1 is formed by a conductive wire 530f, a conductive wire 520c, a conductive wire 510g and the via 525 between the conductive wires 530f and 520c, and the via 515 between the conductive wires 520c and 510g. The signal line BL2 is formed by a conductive wire 530g, a conductive wire 520b, a conductive wire 510e and the via 525 between the conductive wires 530g and 520b, and the via 515 between the conductive wires 520b and 510e. The conductive wires 530g and 530f extend along the X-direction and are formed in the third metal layer M3. The conductive wires 520b and 520c extend along the Y-direction and are formed in the second metal layer M2. The conductive wires 510e and 510g extend along the X-direction and are formed in the first metal layer M1.

The signal lines BL9 and BL10 are coupled to the input pads in the input region 330b of FIG. 3A. The signal line BL9 is formed by a conductive wire 530d, a conductive wire

520i, a conductive wire 510c and the via 525 between the conductive wires 530d and 520i, and the via 515 between the conductive wires 520i and 510c. The signal line BL10 is formed by a conductive wire 530e, a conductive wire 520h, a conductive wire 510a and the via 525 between the conductive wires 530e and 520h, and the via 515 between the conductive wires 520h and 510a. The conductive wires 530d and 530e extend along the X-direction and are formed in the third metal layer M3. The conductive wires 520h and 520i extend along the Y-direction and are formed in the second metal layer M2. The conductive wires 510a and 510c extend along the X-direction and are formed in the first metal layer M1.

In some embodiments, a specific metal layer is reserved for the test array 400A for routing flexibility. For example, the signal lines extending along the Y-direction over the well region 410 are arranged in the same metal layer (i.e., the second metal layer M2). Furthermore, the signal lines outside the well region 410 are arranged in other metal layers except the second metal layer M2.

Figure 10A:
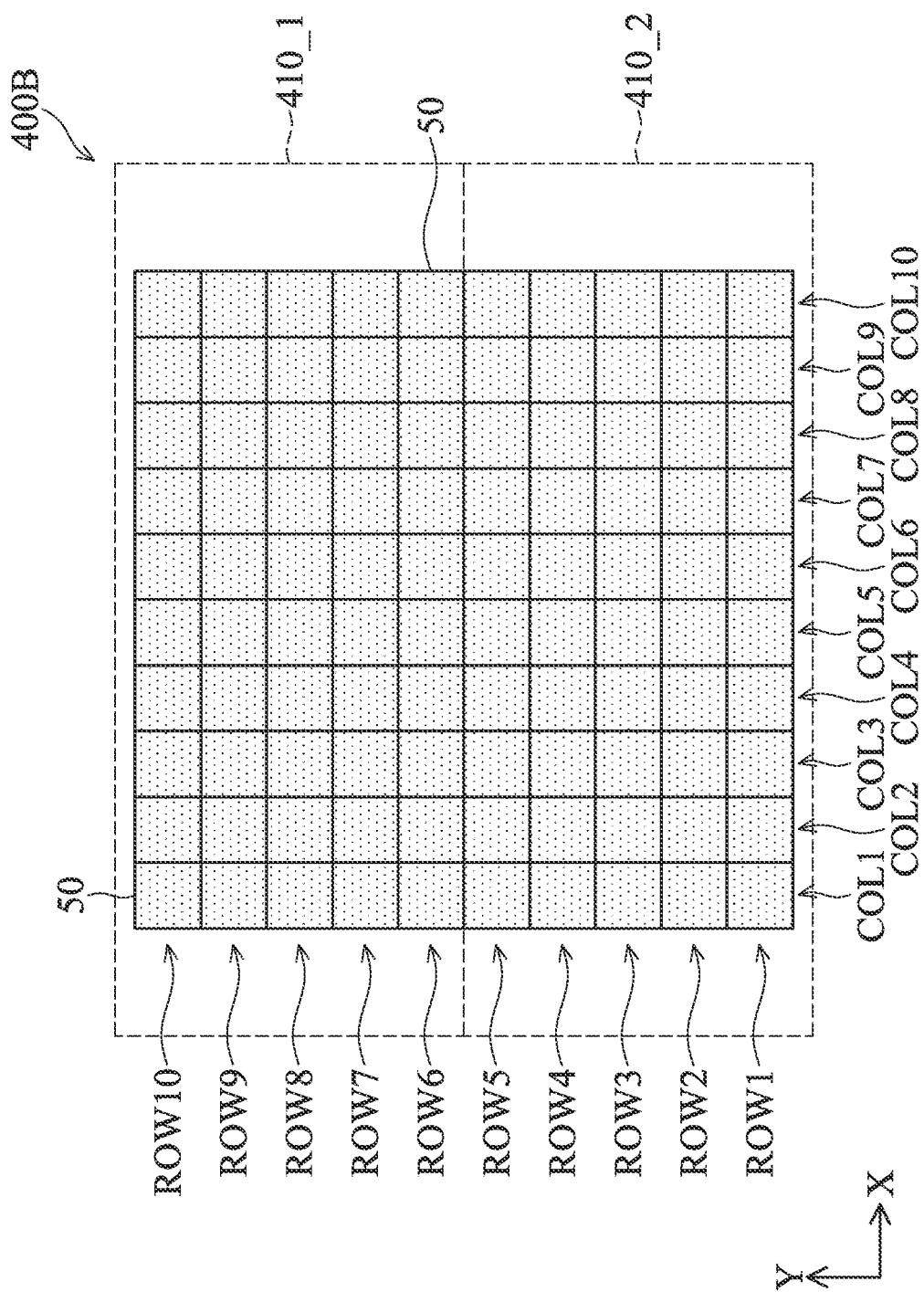
FIG. 10A shows a test array, in accordance with some embodiments of the disclosure.

FIG. 10A shows a test array 400B, in accordance with some embodiments of the disclosure. In FIG. 10A, the test array 400B is formed over the well regions 410_1 and 410_2. The test array 400B includes 10×10 cells 50, and the cells 50 are arranged in the rows ROW1 through ROW10 and the columns COL1 through COL10.

In the test array 400B, the cells 50 arranged in the rows ROW6 through ROW10 are formed over the well region 410_1, and the well region 4101 is coupled to the input pad 450_1 of the well input region 350a through respective signal line. The cells 50 arranged in the rows ROW1 through ROW5 are formed over the well region 410_2, and the well region 410_2 is coupled to the input pad 450_2 of the well input region 350b through respective signal line.

In some embodiments, the well region 410_1 is an N-well region, and the well region 410_2 is a P-well region. Each cell 50 over the region 410_1 includes a P-type transistor, and each cell 50 over the region 410_2 includes an N-type transistor. In such embodiment, when testing the test array 400B, the tester is configured to provide a high voltage (e.g., a high logic level "H" or a VDD signal) to the well region 410_1 through the input pad 450_1, and provide a low voltage (e.g., a grounding signal, a low logic level "L" or a VSS signal) to the well region 410_2 through the input pad 450_2.

In some embodiments, the well region 410_1 is a P-well region, and the well region 410_2 is an N-well region. Each cell 50 over the region 4101 includes an N-type transistor, and each cell 50 over the region 410_2 includes a P-type transistor. In such embodiment, when testing the test array 400B, the tester is configured to provide a low voltage to the well region 410_1 through the input pad 450_1, and provide a high voltage to the well region 410_2 through the input pad 450_2.

Figure 10B:
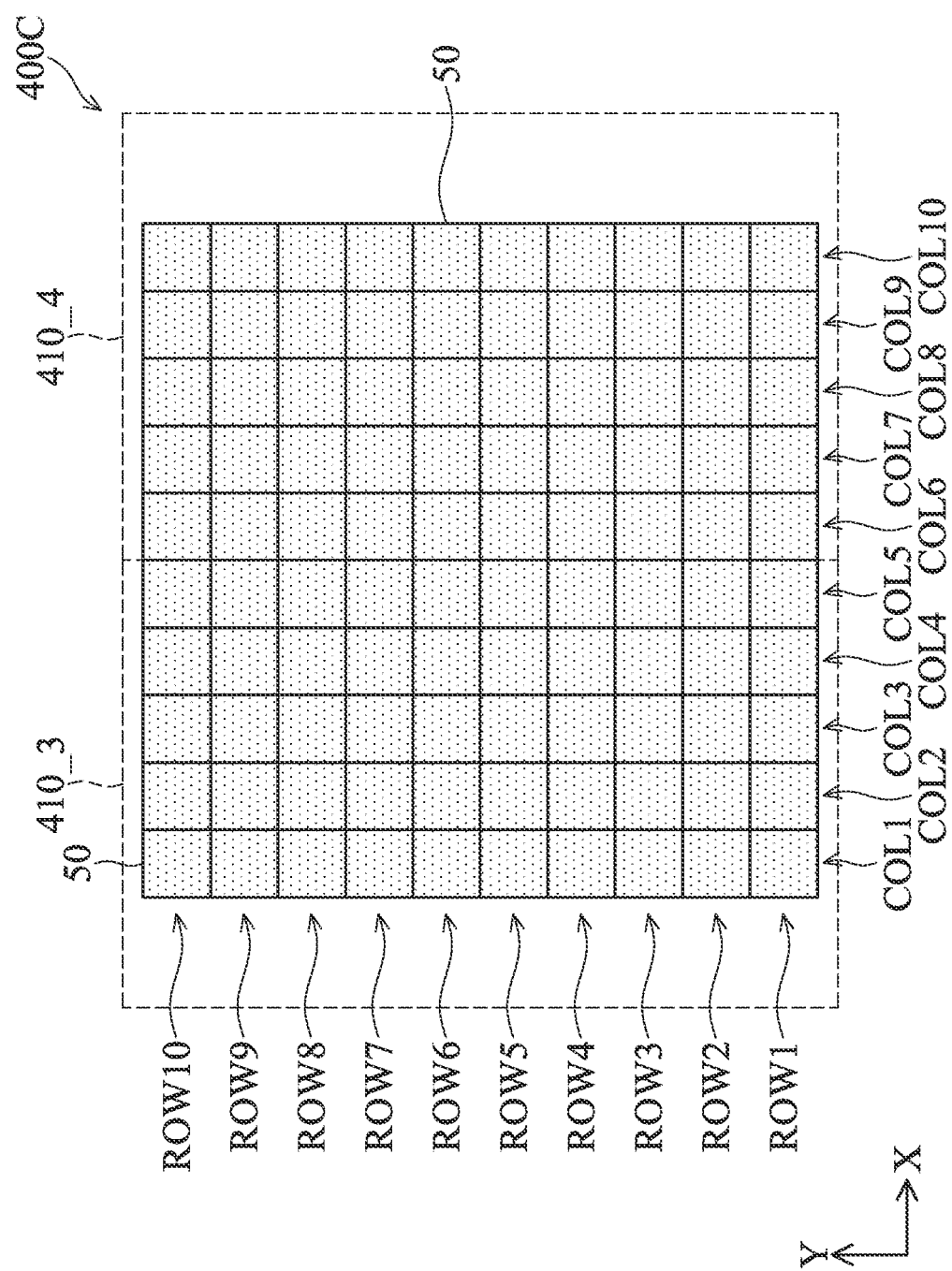
FIG. 10B shows a test array, in accordance with some embodiments of the disclosure.

FIG. 10B shows a test array 400C, in accordance with some embodiments of the disclosure. In FIG. 10B, the test array 400C is formed over the well regions 410_3 and 410_24. The test array 400C includes 10×10 cells 50, and the cells 50 are arranged in the rows ROW1 through ROW10 and the columns COL1 through COL10.

In the test array 400C, the cells 50 arranged in the columns COL1 through COL5 are formed over the well region 410_3, and the well region 410_3 is coupled to the input pad 450_1 of the well input region 350a through respective signal line. The cells 50 arranged in the columns COL6 through COL10 are formed over the well region 410_4, and the well region 410_4 is coupled to the input pad 450_2 of the well input region 350b through respective signal line. As described above, when the well region 410_3 is an N-well region, the well region 410_4 is a P-well region. Conversely, when the well region 410_3 is a P-well region, the well region 410_4 is an N-well region.

Figure 11:
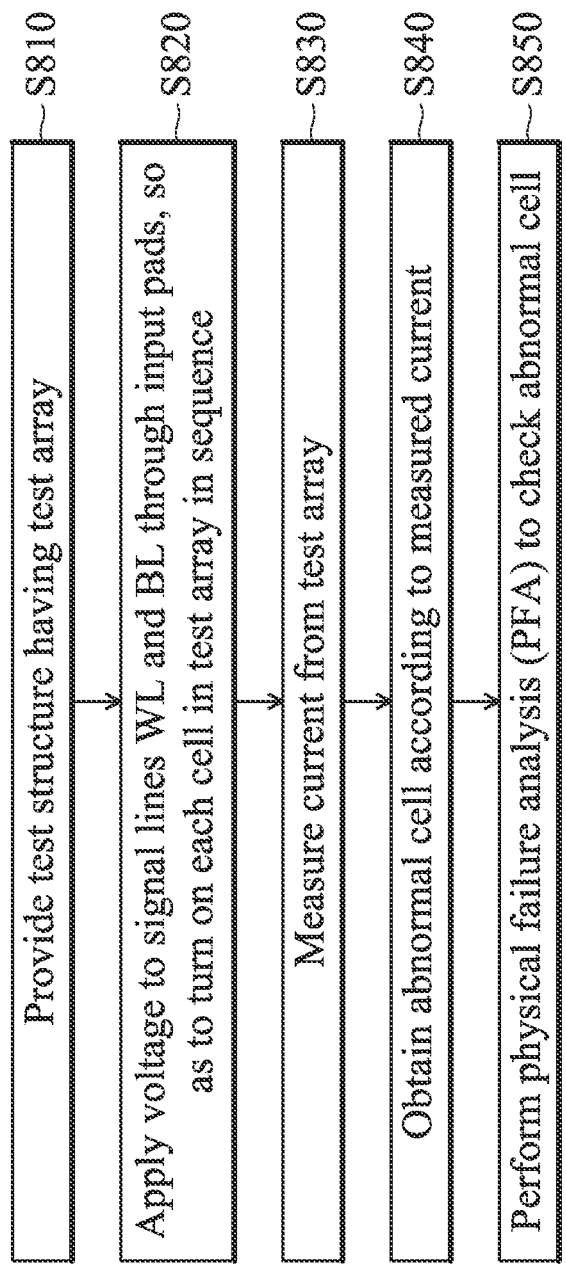
FIG. 11 shows a test method for a test structure, in accordance with some embodiments of the disclosure.

FIG. 11 shows a test method for a test structure, in accordance with some embodiments of the disclosure.

First, in operation S810, the test structure (e.g., 300, 300A and 300B) formed in a scribe line of a wafer is provided. The test structure includes a test array, and the test array includes multiple cells under test arranged in rows and columns of the test array. Furthermore, the test structure further includes a number of test pads for receiving test signals from the tester to the cells of the test array and providing the corresponding measurement result of test array to the tester. As described above, the test array is disposed in the middle of the test pads, and the cells of the test array are coupled to the corresponding test pads.

In operation S820, a first voltage is applied to one of the signal lines WL and a second voltage is applied to one of the signal lines BL by a tester, so as to turn on each cell under test of the test array in sequence. As described above, if the cell includes an N-type transistor under test, a high voltage is applied to the corresponding signal line WL and the corresponding signal line BL. If the cell includes a P-type transistor under test, a high voltage is applied to the corresponding signal line BL and a low voltage is applied to the corresponding signal line BL.

In operation S830, a current from the test array is measured by the tester, so as to determine whether an abnormal cell is present in the test array according to the measured current. For example, it is determined whether the measured current is greater than the current flowing through the turned-on cell.

In operation S840, the abnormal cells in the test array are obtained according to current measured in operation S830. As described above, if the cells sharing the signal line WL and signal line BL with the turned-on cell are normal, the current flowing through the turned-on cell is obtained by the tester. If one cell sharing the signal line WL or the signal line BL with the turned-on cell is abnormal, the current flowing through the turned-on cell and the short current caused by the abnormal cell are obtained by the tester. Therefore, when the measured current is greater than the current flowing through the turned-on cell, the tester may determine that the cells sharing the signal line WL or the signal line BL with the turned-on cell may be abnormal. Furthermore, if the measured current of the cells sharing the signal line WL or the signal line BL are the same, the tester may group the cells as the vertical cell group (e.g., the vertical cell groups 610 through 630 of FIG. 7B) or the horizontal cell groups (e.g., horizontal cell groups 710 through 730 of FIG. 8B).

In operation S850, PFA is performed to check the abnormal cell according to the location of the abnormal cell. For example, a cross-section examination is performed on the abnormal cell based on the location of the abnormal cell.

Embodiments of test structures and test methods thereof are provided. In the test structure, a high-density teat array formed by multiple cells under test is disposed in a small area between two test pads. When one cell in the test array is turned by the corresponding signal lines WL and BL, the off-current of other cells in the same corresponding signal line WL or BL are also measured and then the locations of the abnormal cells are obtained for PFA procedures, so as to improve manufacturing technologies for the cells.

In some embodiments, a test structure on a wafer is provided. The test structure includes a plurality of cells under test, a first output pad and a second output pad, a plurality of first input pads, and a plurality of second input pads. The cells are arranged in the rows and columns of a test array and formed in a scribe line of the wafer. The first and second output pads are formed on opposite sides of the test array and in the scribe line. The first output pad is coupled to the cells in one half of the rows of the test array, and the second output pad is coupled to the cells in the other half of the rows of the test array. Each of the first input pads is coupled to the cells in the respective column of the test array. Each of the second input pads is coupled to the cells in the respective row of the test array. When a first voltage is applied to one of the first input pads and a second voltage is applied to one of the second input pads, the cell coupled to the one of the first input pads and the one of the second input pads is turned on and a current flowing through the turned-on cell is measured through the first or second output pad coupled to the turned-on cell.

In some embodiments, a test structure on a wafer is provided. The test structure includes a plurality of cells under test, a first output pad and a second output pad, a plurality of first signal lines, a plurality of second signal lines, a plurality of first input pads and a plurality of second input pads. The cells are arranged in the rows and columns of a test array and formed in a scribe line of the wafer. The first output pad and the second output pad are formed on opposite sides of the test array and in the scribe line. The first output pad is coupled to half of the cells, and the second output pad is coupled to the remaining cells. Each of the first signal lines extends in a first direction over one of the columns of the test array. Each of the second signal lines extends in a second direction over one of the rows of the test array. Each of the first input pads is coupled to the cells in the respective column of the test array through one of the first signal lines. Each of the second input pads is coupled to the cells in the respective row of the test array through one of the second signal lines. The first and second output pads and the test array are disposed between the first input pads and the second input pads. The first direction is perpendicular to the second direction.

In some embodiments, a test method for a test structure is provided. A test structure formed in a scribe line of a wafer is provided. The test structure includes a test array, a first output pad and a second output pad, a plurality of first input pads and a plurality of second input pads. The test array includes a plurality of cells arranged in rows and columns. The first output pad and the second output pad are formed on opposite sides of the test array and in the scribe line. The first output pad is coupled to the cells in one half of the rows of the test array, and the second output pad is coupled to the cells in the other half of the rows of the test array. Each of the first input pads is coupled to the cells in respective column of the test array. Each of the second input pads is coupled to the cells in respective row of the test array. A first voltage is applied to one of the first input pads and a second voltage is applied to one of the second input pads, so as to turn on the cell coupled to the one of the first input pads and the one of the second input pads. A current is measured from the first or second output pad coupled to the turned-on cell. It is determined whether the cell sharing the one of the first input pads or the one of the second input pads is abnormal according to the measured current.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A test structure on a wafer, comprising:
    a plurality of cells under test, wherein the cells are arranged in rows and columns of a test array and formed in a scribe line of the wafer;
    a first output pad and a second output pad formed on opposite sides of the test array and in the scribe line, wherein the first output pad is coupled to the cells in one half of the rows of the test array, and the second output pad is coupled to the cells in the other half of the rows of the test array;
    a plurality of first input pads, wherein each of the first input pads is coupled to the cells in respective column of the test array; and
    a plurality of second input pads, wherein each of the second input pads is coupled to the cells in respective row of the test array,
    wherein when a first voltage is applied to one of the first input pads and a second voltage is applied to one of the second input pads, the cell coupled to the one of the first input pads and the one of the second input pads is turned on and a current flowing through the turned-on cell is measured through the first or second output pad coupled to the turned-on cell.

2. The test structure as claimed in claim 1, wherein the first output pad is disposed between the test array and one half of the first input pads, and the second output pad is disposed between the test array and the other half of the first input pads.

3. The test structure as claimed in claim 1, wherein the first output pad is disposed between the test array and one half of the second input pads, and the second output pad is disposed between the test array and the other half of the second input pads.

4. The test structure as claimed in claim 1, wherein the test array is formed over a well region, and each of the cells comprises:
    a transistor having a gate coupled to the corresponding first input pad, a drain coupled to the corresponding second input pad, and a source coupled to the first or second output pad.

5. The test structure as claimed in claim 4, further comprising:
    a third input pad coupled to the well region of the test array,
    wherein when the transistor is an N-type transistor, the first and second voltages are high voltages, and a low voltage is applied to the third input pad,
    wherein when the transistor is a P-type transistor, the first voltage is a low voltage and the second voltage is a high voltage, and the high voltage is applied to the third input pad.

6. The test structure as claimed in claim 1, wherein half of the cells are formed over a P-type well region, and each of the cells over the P-type well region comprises:
    an N-type transistor having a gate coupled to the corresponding first input pad, a drain coupled to the corresponding second input pad, and a source coupled to the first output pad, wherein the remaining cells under test are formed over an N-type well region, and each of the cells over the N-type well region comprises:
    a P-type transistor having a gate coupled to the corresponding first input pad, a drain coupled to the corresponding second input pad, and a source coupled to the second output pad.

7. The test structure as claimed in claim 6, further comprising:
    a third input pad coupled to the P-type well region; and
    a fourth input pad coupled to the N-type well region,
    wherein a low voltage is applied to the third input pad, and a high voltage is applied to the fourth input pad.

8. The test structure as claimed in claim 7, wherein the first input pads, the second input pads, the first output pad, the second output pad and the test array are disposed between the third and fourth input pads.

9. The test structure as claimed in claim 1, wherein the first input pads are divided into a first group and a second group, wherein the first output pad is disposed between the first group of the first input pads and the test array, and the second output pad is disposed between the second group of the first input pads and the test array.

10. The test structure as claimed in claim 1, wherein the second input pads are divided into a first group and a second group, wherein the second output pad is disposed between the first group of the second input pads and the test array, and the second output pad is disposed between the second group of the second input pads and the test array.

11. A test structure on a wafer, comprising:
    a plurality of cells under test, wherein the cells are arranged in rows and columns of a test array and formed in a scribe line of the wafer;
    a first output pad and a second output pad formed on opposite sides of the test array and in the scribe line, wherein the first output pad is coupled to half of the cells, and the second output pad is coupled to the remaining cells;
    a plurality of first signal lines, each extending in a first direction over one of the columns of the test array;
    a plurality of second signal lines, each extending in a second direction over one of the rows of the test array;
    a plurality of first input pads, wherein each of the first input pads is coupled to the cells in respective column of the test array through one of the first signal lines; and
    a plurality of second input pads, wherein each of the second input pads is coupled to the cells in respective row of the test array through one of the second signal lines,
    wherein the first and second output pads and the test array are disposed between the first input pads and the second input pads,
    wherein the first direction is perpendicular to the second direction.

12. The test structure as claimed in claim 11, wherein after a first voltage is applied to one of the first input pads and a second voltage is applied to one of the second input pads, a current of the cell coupled to the one of the first input pads and the one of the second input pads and a current of the cell sharing the one of the first input pads or the one of the second input pads are measured via the first or second output pad when the cell sharing the one of the first input pads or the one of the second input pads is abnormal.

13. The test structure as claimed in claim 11, wherein the test array is formed over a well region, and each of the cells comprises:
    a transistor having a gate coupled to the corresponding first input pad, a drain coupled to the corresponding second input pad, and a source coupled to the first or second output pad.

14. The test structure as claimed in claim 13, further comprising:
    a third input pad coupled to the well region of the test array,
    wherein when the transistor is an N-type transistor, a low voltage is applied to the third input pad,
    wherein when the transistor is a P-type transistor, a high voltage is applied to the third input pad.

15. The test structure as claimed in claim 11, wherein the first output pad is disposed between the test array and one half of the first input pads, and the second output pad is disposed between the test array and the other half of the first input pads.

16. The test structure as claimed in claim 11, wherein the first output pad is disposed between the test array and one half of the second input pads, and the second output pad is disposed between the test array and the other half of the second input pads.

17. A test method for a test structure, comprising:
    providing a test structure formed in a scribe line of a wafer, wherein the test structure comprises:
        a test array comprising a plurality of cells arranged in rows and columns;
        a first output pad and a second output pad formed on opposite sides of the test array and in the scribe line, wherein the first output pad is coupled to the cells in one half of the rows of the test array, and the second output pad is coupled to the cells in the other half of the rows of the test array;
        a plurality of first input pads, wherein each of the first input pads is coupled to the cells in respective column of the test array; and
        a plurality of second input pads, wherein each of the second input pads is coupled to the cells in respective row of the test array,
    applying a first voltage to one of the first input pads and applying a second voltage to one of the second input pads to turn on the cell coupled to the one of the first input pads and the one of the second input pads;
    measuring a current from the first or second output pad coupled to the turned-on cell; and
    determining whether the cell sharing the one of the first input pads or the one of the second input pads is abnormal according to the measured current.

18. The test method as claimed in claim 17, wherein the test array is formed over a well region, and each of the cells comprises:
    a transistor having a gate coupled to the corresponding first input pad, a drain coupled to the corresponding second input pad, and a source coupled to the first or second output pad.

19. The test method as claimed in claim 18, wherein the test structure further comprises:
    a third input pad coupled to the well region of the test array,
    wherein when the transistor is an N-type transistor, the first and second voltages are high voltages, and a low voltage is applied to the third input pad,
    wherein when the transistor is a P-type transistor, the first voltage is a low voltage and the second voltage is a high voltage, and the high voltage is applied to the third input pad.

20. The test method as claimed in claim 17, wherein determining whether the cell sharing the one of the first input pads or the one of the second input pads is abnormal according to the measured current further comprises:
  determining the cell sharing the one of the first input pads or the one of the second input pads is abnormal when the measured current is greater than a current flowing through the turned-on cell; and
  determining the cell sharing the one of the first input pads or the one of the second input pads is normal when the measured current is equal to the current flowing through the turned-on cell.

\* \* \* \* \*